United States Patent
Hirayama

(10) Patent No.: US 8,901,196 B2
(45) Date of Patent: Dec. 2, 2014

(54) LIQUID RESIN COMPOSITION FOR PRODUCTION OF OPTICAL WAVEGUIDE, OPTICAL WAVEGUIDE PRODUCED BY USING THE LIQUID RESIN COMPOSITION, AND PRODUCTION METHOD OF THE OPTICAL WAVEGUIDE

(75) Inventor: Tomoyuki Hirayama, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 563 days.

(21) Appl. No.: 12/985,711

(22) Filed: Jan. 6, 2011

(65) Prior Publication Data

US 2011/0182555 A1    Jul. 28, 2011

Related U.S. Application Data

(60) Provisional application No. 61/302,793, filed on Feb. 9, 2010.

(30) Foreign Application Priority Data

Jan. 25, 2010   (JP) ................................. 2010-013668

(51) Int. Cl.
| | | |
|---|---|---|
| C09D 4/06 | (2006.01) | |
| C08F 265/06 | (2006.01) | |
| G02B 1/04 | (2006.01) | |
| G02B 6/122 | (2006.01) | |
| G02B 6/138 | (2006.01) | |
| G03F 7/027 | (2006.01) | |
| C08K 5/37 | (2006.01) | |

(52) U.S. Cl.
CPC ............... C09D 4/06 (2013.01); C08F 265/06 (2013.01); G02B 1/045 (2013.01); G02B 6/1221 (2013.01); G02B 6/138 (2013.01); G03F 7/0275 (2013.01); C08K 5/37 (2013.01)
USPC ........................................................ 522/118

(58) Field of Classification Search
USPC ......... 522/42, 46, 48, 60, 173, 178, 180, 182, 522/44, 79, 174, 181, 184, 186; 430/281.1, 430/268.1, 269; 385/129, 131; 427/510
See application file for complete search history.

(56) References Cited

U.S. PATENT DOCUMENTS

| | | | | |
|---|---|---|---|---|
| 3,908,039 | A * | 9/1975 | Guthrie et al. | 427/517 |
| 5,236,967 | A * | 8/1993 | Ohkawa et al. | 522/32 |
| 7,072,563 | B2 | 7/2006 | Shelnut et al. | |
| 7,169,825 | B2 * | 1/2007 | Narayan-Sarathy et al. | 522/13 |
| 7,267,931 | B2 * | 9/2007 | Mune et al. | 430/321 |
| 8,017,193 | B1 * | 9/2011 | Zhou et al. | 427/510 |
| 2006/0029891 | A1 | 2/2006 | Mune et al. | |
| 2007/0021521 | A1 * | 1/2007 | Cheng et al. | 522/1 |
| 2010/0105795 | A1 * | 4/2010 | Maandi et al. | 522/48 |

FOREIGN PATENT DOCUMENTS

| | | |
|---|---|---|
| CN | 1734302 A | 2/2006 |
| JP | 1-182314 A | 7/1989 |
| JP | 2001-281475 A | 10/2001 |
| JP | 2005-154715 A | 6/2005 |
| JP | 2006-47506 A | 2/2006 |
| JP | 2007-269969 A | 10/2007 |
| JP | 2008-285648 A | 11/2008 |
| JP | 2009-260231 A | 11/2009 |

OTHER PUBLICATIONS

Japanese Office Action dated May 28, 2013, issued in corresponding Japanese Patent Application No. 2010-013668, w/ English translation.

Chinese Office Action dated Dec. 4, 2013 issued in the Chinese Application No. 201110022475.7 with English Translation. (19 pages).

* cited by examiner

*Primary Examiner* — Sanza McClendon

(74) *Attorney, Agent, or Firm* — Westerman, Hattori, Daniels & Adrian, LLP

(57) ABSTRACT

A liquid resin composition is provided which satisfies both a tackiness-free requirement and a curing sensitivity requirement for production of an optical waveguide by a roll-to-roll process. An optical waveguide produced by using the liquid resin composition and a production method of the optical waveguide are also provided. The liquid resin composition for the production of the optical waveguide comprises:
(A) a (meth)acrylate polymer, as a major component, having a plurality of (meth)acryl groups in its molecule;
(B) a liquid thiol monomer having a plurality of thiol groups in its molecule; and
(C) a photopolymerization initiator.

6 Claims, No Drawings

LIQUID RESIN COMPOSITION FOR PRODUCTION OF OPTICAL WAVEGUIDE, OPTICAL WAVEGUIDE PRODUCED BY USING THE LIQUID RESIN COMPOSITION, AND PRODUCTION METHOD OF THE OPTICAL WAVEGUIDE

RELATED APPLICATIONS

This application claims the benefit of U.S. Provisional Application No. 61/302,793, filed Feb. 9, 2010, which is hereby incorporated by reference.

BACKGROUND OF THE INVENTION

1. Field of the Invention

The present invention relates to a liquid resin composition for production of an optical waveguide, an optical waveguide produced by using the liquid resin composition, and a production method of the optical waveguide.

2. Description of the Related Art

An optical waveguide typically includes a core portion and a cladding portion. With a difference in refractive index between the core portion and the cladding portion, the core portion serves as a light passage for transmission of a light signal. Exemplary materials for conventional optical waveguides include inorganic materials such as quartz glass and silicon, and organic materials such as highly pure polyimide resins, polyamide resins and polyether resins.

In recent years, various optical waveguide production methods have been developed, in which a photosensitive resin solution (photosensitive monomer mixture solution) is used as an optical waveguide material, and the core portion of the optical waveguide is formed by forming a coating layer of the solution and photo-curing the coating layer by irradiation of the coating layer with ultraviolet radiation via a mask of a predetermined pattern for easy production of the optical waveguide (see, for example, JP-A-2001-281475).

However, the photosensitive resin solution conventionally used in the aforementioned application has a higher photocuring sensitivity, and the coating layer (uncured layer) of the photosensitive resin solution has a tacky surface (or has surface tackiness). This makes it difficult to employ a continuous process such as a roll-to-roll process using a coating machine such as a multi-coater. In the roll-to-roll process, the coating layer is wound up to be brought into contact with a previously wound portion thereof, whereby the previously wound portion and the newly wound portion of the coating layer adhere to each other. This may result in breakage of the adhering portions of the coating layer.

Where the roll-to-roll process is employed for the formation of the coating layer, a so-called "ordinary-temperature solid polymer" which is in a solid phase at an ordinary temperature is used for the photosensitive resin solution (see, for example, JP-A-2005-154715).

SUMMARY OF THE INVENTION

Where the ordinary-temperature solid polymer described above is used, however, active species generated by the irradiation with the ultraviolet radiation are liable to have lower mobility, thereby deteriorating the curability of the photosensitive resin solution. A common method for increasing the mobility is to add a liquid monomer component to the polymer component. However, the addition of the liquid monomer may result in tackiness, so that the amount of the liquid monomer to be added is limited. Therefore, significant improvement of the curing sensitivity cannot be achieved. The expression "the active species generated by the irradiation with the ultraviolet radiation are liable to have lower mobility" herein means that an acid component (protons) generated by the irradiation with the ultraviolet radiation does not easily move because no liquid component is contained (only the solid component is contained) and, therefore, the possibility that the protons encounter epoxy groups for reaction is reduced. Further, the expression "increasing the mobility" herein means to increase the mobility (diffusion) of the protons.

Thus, there is a trade-off relationship between the tackiness and the curing sensitivity. For this reason, an optical waveguide material suitable for the roll-to-roll process including the winding step is not provided yet. Accordingly, there is an eager demand for an optical waveguide material satisfying both the tackiness-free requirement and the curing sensitivity requirement.

In view of the foregoing, it is an object of the present invention to provide a liquid resin composition which satisfies both the tackiness-free requirement and the curing sensitivity requirement for production of an optical waveguide by a roll-to-roll process, and to provide an optical waveguide produced by using the liquid resin composition and a production method of the optical waveguide.

According to a first aspect of the present invention to achieve the object described above, there is provided a liquid resin composition for production of an optical waveguide, the liquid resin composition comprising: (A) a (meth)acrylate polymer, as a major component, having a plurality of (meth)acryl groups in its molecule; (B) a liquid thiol monomer having a plurality of thiol groups in its molecule; and (C) a photopolymerization initiator.

According to a second aspect of the present invention, there is provided an optical waveguide, which comprises a core portion for transmission of a light signal, and a cladding portion, at least one of the cladding portion and the core portion being formed from the resin composition according to the first inventive aspect.

According to a third aspect of the present invention, there is provided an optical waveguide production method for continuously producing an optical waveguide by a roll-to-roll process, the method comprising the steps of: applying the resin composition according to the first inventive aspect on a flexible base paid out from a first roll to form a coating layer; irradiating the coating layer in a predetermined pattern with ultraviolet radiation to cure an irradiated portion of the coating layer to form a core portion of the optical waveguide; and taking up the resulting optical waveguide around a second roll.

The inventor of the present invention conducted intensive studies to solve the aforementioned problem. In the course of the studies, the inventor found that both the tackiness-free requirement and the curability requirement can be satisfied by adding the liquid thiol monomer having a plurality of thiol groups in its molecule to the photo-curable resin composition containing a (meth)acrylate polymer, as a major component (base polymer), having a plurality of (meth)acryl groups in its molecule.

The following mechanism supposedly makes it possible to create such an effect. The specific base polymer described above exhibits a tackiness-free property attributable to the solid phase at the ordinary temperature and a higher curing sensitivity attributable to a plurality of (meth)acryl functional groups present at side chains of the polymer. Further, the liquid thiol monomer is introduced into the specific base polymer, thereby making it possible to increase the mobility of active species while ensuring the tackiness-free property. An ene-thiol polymerization of the liquid thiol monomer (which is highly sensitive and free from oxygen inhibition) proceeds simultaneously with the photopolymerization reaction of the (meth)acryl functional groups of the base polymer, thereby supposedly creating the aforementioned effect.

As described above, the inventive resin composition for the production of the optical waveguide contains the (meth)acrylate polymer, as the major component, having the plurality of (meth)acryl groups in its molecule, the liquid thiol monomer having the plurality of thiol groups in its molecule, and the photopolymerization initiator. Therefore, an uncured film formed of the inventive resin composition has the tackiness-free property and the higher photo-curability. Accordingly, the inventive resin composition is suitable for the continuous process such as the roll-to-roll process. In addition, the inventive resin composition has excellent curability without reduction in the mobility of the active species generated by the irradiation with the ultraviolet radiation.

DETAILED DESCRIPTION

Embodiments of the present invention will hereinafter be described.

An inventive resin composition for production of an optical waveguide is prepared in a liquid form by using a (meth)acrylate polymer (A), as a major component, having a plurality of (meth)acryl groups in its molecule, a liquid thiol monomer (B) having a plurality of thiol groups in its molecule, and a photopolymerization initiator (C). The expression "major component" herein means a component that significantly influences the properties of the composition, and is typically contained in a proportion of not less than 60 wt % based on the overall weight of the resin composition. In the present invention, the (meth)acryl group means an acryl group or a methacryl group. Similarly, the (meth)acrylate polymer means an acrylate polymer or a methacrylate polymer.

Examples of the specific (meth)acrylate polymer (A) include linear polymers and branched polymers each prepared by copolymerizing any of (meth)acrylate monomers such as trimethylolpropane tri(meth)acrylate, pentaerythritol tetra(meth)acrylate, 1,2-ethylene glycol di(meth)acrylate, 1,6-hexanediol di(meth)acrylate and bisphenol-A di(meth)acrylate, and linear polymers and branched polymers each prepared by copolymerizing any of the aforesaid (meth)acrylate monomers with other monomers. These polymers may be used either alone or in combination.

The specific (meth)acrylate polymer (A) preferably has a weight average molecular weight (Mw) of 1000 to 50000, particularly preferably 10000 to 20000. If the weight average molecular weight (Mw) of the (meth)acrylate polymer (A) is less than the aforesaid range, a coating film formed by application of the resulting resin composition tends to be brittle, suffering from cracking during the roll-to-toll process. On the other hand, if the weight average molecular weight (Mw) is greater than the aforesaid range, the resulting resin composition tends to have lower solubility in a solvent. This makes it difficult to control the thickness of a coating film, and deteriorates the developability.

Examples of the solvent usable for the specific (meth)acrylate polymer (A) as required include: polar solvents including esters such as methyl acetate and butyl acetate, and ketones such as acetone, methyl ethyl ketone and methyl isobutyl ketone, dimethylforamide and dimethyl sulfoxide; halogen-containing solvents such as 1,1,1-trichloroethane and chloroform; ethers such as tetrahydrofuran and dioxane; aromatic solvents such as benzene, toluene and xylene; and fluorinated inert liquids such as perfluorooctane and perfluorotri-N-butylamine. Any of these solvents may be used in combination, for example, in a total proportion of about 30 to about 200 parts by weight based on 100 parts by weight (hereinafter referred to simply as "parts") of the (meth)acrylate polymer (A).

Examples of the specific liquid thiol monomer (B) to be used in combination with the (meth)acrylate polymer (A) include pentaerythritol tetrakis(3-mercaptopropionate) (PEMP), tris[(3-mercaptopropionyloxy)ethyl]isocyanurate (TEMPIC), trimethylolpropane tris(3-mercaptopropionate) (TMMP) and dipentaerythritol hexakis(3-mercaptopropionate) (DPMP), which may be used either alone or in combination. Among these liquid thiol monomers, pentaerythritol tetrakis(3-mercaptopropionate) (PEMP) is preferred for reactivity and thermal stability.

The liquid thiol monomer (B) is preferably blended in a proportion of 1 to 10 parts, particularly preferably 3 to 5 parts, more preferably 2 to 3 parts, based on 100 parts of the (meth)acrylate polymer (A). If the proportion of the liquid thiol monomer (B) is less than the aforesaid range, it is impossible to improve the mobility of active species generated by irradiation with ultraviolet radiation, thereby impairing the curability. On the other hand, if the proportion of the liquid thiol monomer (B) is greater than the aforesaid range, the resulting resin composition is liable to have tackiness.

Examples of the photopolymerization initiator (C) to be used in combination with the (meth)acrylate polymer (A) and the liquid thiol monomer (B) include radical photopolymerization initiators such as 2-methyl-1-[4-(methylthio)phenyl]-2-morpholinopropane-1-one, 1-hydroxycyclohexyl phenyl ketone and 2-benzyl-2-dimethylamino-1-(4-morpholinophenyl)butanone-1, which may be used either alone or in combination. It is particularly preferred to employ 1-hydroxycyclohexyl phenyl ketone and 2-methyl-1-[4-(methylthio)phenyl]-2-morpholinopropane-1-one in combination, because the resulting resin composition is excellent in surface curability. Commercially available examples of the photopolymerization initiator include IRGACURE 184, IRGACURE 907, IRGACURE 369 and IRGCURE 127 from Nagase & Co., Ltd.

The photopolymerization initiator (C) is preferably blended in a proportion of 1 to 5 parts, particularly preferably 2 to 3 parts, based on 100 parts of the (meth)acrylate polymer (A). If the proportion of the photopolymerization initiator (C) is less than the aforesaid range, the curability tends to be impaired. On the other hand, if the proportion of the photopolymerization initiator (C) is greater than the aforesaid range, the resulting resin composition is liable to suffer from an internal curing failure.

The inventive resin composition may optionally contain a (meth)acrylate monomer such as ethoxylated bisphenol-A diacrylate or ethoxylated bisphenol-A dimethacrylate, an adhesiveness imparting agent, a flexibility imparting agent, an antioxidant, a defoaming agent and other additives in addition to the components (A) to (C) described above. These additives may be used either alone or in combination. In order to ensure the effects of the present invention, it is preferred to blend any of these additives in a total proportion of not greater than 5 wt % based on the overall weight of the resin composition. Commercially available examples of the (meth)acrylate monomer include ABE-300 and BPE-500 from Shin-Nakamura Chemical Co., Ltd.

The inventive resin composition is prepared by blending the aforesaid components in the aforesaid proportions and mixing the components together. Since the inventive resin composition is provided in a liquid form, a film of the resin composition can be formed by a coating method.

The inventive resin composition (varnish) preferably has a viscosity of 1000 to 3000 mPa·s (at 25° C.), more preferably 1500 to 2000 mPa·s (at 25° C.). The viscosity is measured, for example, by means of a Brookfield's viscometer (DV-I+).

An inventive optical waveguide to be produced by using the inventive resin composition (varnish), for example, has the following construction. The optical waveguide includes a core portion for transmission of a light signal, and a cladding portion. At least one of the core portion and the cladding portion is formed from the inventive resin composition described above. The core portion has a predetermined pattern (optical waveguide pattern). The cladding portion should have a smaller refractive index than the core portion. A difference in refractive index between the core portion and the cladding portion can be controlled by employing different materials and different proportions of the materials for the cladding portion and the core portion.

The inventive optical waveguide may be constructed such that a cladding layer (under-cladding layer) is provided as a base and the core portion having the predetermined pattern is provided on the base and exposed in air. In this case, the refractive index of the core portion is set higher than that of the air for preventing the scattering of light from the core portion. Alternatively, the inventive optical waveguide may be constructed such that the core portion having the predetermined pattern is provided on an under-cladding layer provided separately from a base and an over-cladding layer is provided over the core portion.

The optical waveguide can be produced, for example, in the following manner by the roll-to-roll process. In the roll-to-roll process, the resin composition (varnish) described above is applied onto a flexible base paid out from a first roll to form a coating layer on the base. Then, the coating layer is irradiated in a predetermined pattern with ultraviolet radiation, whereby an irradiated portion of the coating layer is cured to form a core portion of the optical waveguide. The resulting optical waveguide is taken up around a second roll. As described above, the resin composition is free from tackiness and, therefore, is advantageously employed for the continuous roll-to-roll process. This results in higher productivity.

For the formation of the core portion, the coating layer is irradiated in the predetermined pattern with the ultraviolet radiation via a photomask to be thereby exposed to the ultraviolet radiation. Exemplary light sources for the irradiation include a low pressure mercury lamp, a high pressure mercury lamp, an ultra high pressure mercury lamp and a xenon lamp. The dose for the irradiation is preferably 100 to 3000 mJ/cm$^2$.

An exposed portion of the coating layer resulting from the irradiation with the ultraviolet radiation serves as the core portion. An unexposed portion of the coating layer (not irradiated with the ultraviolet radiation) is dissolved away with a developing liquid. Alternatively, the unexposed portion of the coating layer may be thermally cured, for example, by a heat treatment to form the cladding portion of the optical waveguide.

Examples of the flexible base include a polyethylene terephthalate (PET) film, a polyethylene naphthalate film, a polyimide film, and metal foils such as a copper foil and a stainless foil. The flexible base typically has a thickness of 10 µm to 5 mm.

The flexible base per se may serve as a cladding layer. As required, an under-cladding layer may be formed on the flexible base, and the core portion may be formed on the under-cladding layer. As required, an over-cladding layer may be formed over the core portion. For example, a cladding material is applied on the flexible base to form a coating film, which is in turn cured to form the under-cladding layer. Then, a core material is applied on the under-cladding layer to form a coating film, which is in turn exposed in a predetermined pattern to ultraviolet radiation to be thereby cured. Thereafter, an uncured portion of the coating film is dissolved away with a developing liquid, whereby the core portion is formed. Further, the cladding material is applied over the core portion and cured to form the over-cladding layer. For the formation of the under-cladding layer and the over-cladding layer, the curing may be achieved by a heat treatment or by irradiation with ultraviolet radiation.

In the production of the optical waveguide, the formation of the coating film may be achieved by the roll-to-roll process, or by a coating method using a spin coater, a coater, a disk coater or a bar coater, a screen printing method or an electrostatic coating method.

If the roll-to-roll process is not employed, a nonflexible base such as a quartz glass plate, a silicon wafer, a ceramic plate or a glass epoxy resin plate may be used.

The base may be removed from the optical waveguide produced in the aforesaid manner. Thus, a film optical waveguide can be provided. With this arrangement, the optical waveguide is more excellent in flexibility.

The inventive optical waveguide may be used as a linear optical waveguide, a curved optical waveguide, a cross optical waveguide, a Y-branched optical waveguide, a slab optical waveguide, a Mach-Zehnder optical waveguide, an AWG optical waveguide, a grating or an optical waveguide lens. Exemplary optical devices employing any of these optical waveguides include a wavelength filter, an optical switch, an optical demultiplexer, an optical multiplexer, an optical multiplexer/demultiplexer, an optical amplifier, a wavelength modulator, an wavelength divider, an optical splitter, a directional coupler, and an optical transmission hybrid module including a laser diode and a photo diode in combination.

EXAMPLES

Next, inventive examples will be described in conjunction with a comparative example. However, the present invention is not limited to these inventive examples.

Prior to the description of the inventive examples and the comparative example, ingredients employed in these examples will be described below.

Methacrylate Polymer (A)

A copolymer of bisphenol-A dimethacrylate and a diacid anhydride (FNR-019 available from Nagase ChemteX Corporation)

Liquid Thiol Monomer (B)

Pentaerythritol tetrakis(3-mercaptopropionate) (PEMP) (available from Sakai Chemical Industry Co., Ltd.)

Acrylate Monomer

Ethoxylated bisphenol-A diacrylate (ABE-300 available from Shin-Nakamura Chemical Co., Ltd.)

Photopolymerization Initiator (i) (C)

2-Methyl-1-[4-(methylthio)phenyl]-2-morpholinopropane-1-one (IRGACURE 907 available from Nagase & Co., Ltd.)

Photopolymerization Initiator (ii) (C)

1-Hydroxycyclohexyl phenyl ketone (IRGACURE 184 available from Nagase & Co., Ltd.)

Example 1

In a light-blocking brown bottle, 10 g of a 56% butyl acetate solution of the methacrylate polymer (having a polymer content of 5.6 g), 0.28 g of the liquid thiol monomer, 0.06 g of the photopolymerization initiator (i) and 0.6 g of the photopolymerization initiator (ii) were blended and mixed at an ordinary temperature for dissolution. Thus, a resin composition (varnish) was prepared for production of an optical waveguide.

The varnish thus prepared was applied on a thermosetting epoxy film (having a thickness of 15 μm) by means of an applicator (having an applicator gap width of 150 μm), and thermally dried at 150° C. on a hot plate for 3 minutes. The resulting epoxy film was further thermally dried at 150° C. in a drying oven for 2 minutes. Thus, an uncured core film layer was formed on the epoxy film. Subsequently, the uncured core film layer was exposed via a photomask at 500 mJ/cm$^2$ by a low pressure mercury lamp to be thereby partly cured. Thereafter, the core film layer was developed with a 0.7% sodium carbonate aqueous solution by means of a spray developing device. Thus, the core film layer was patterned to form a core layer. The core layer resulting from the patterning has a projection width of 15 μm and a recess (groove) width of 15 μm in section.

Example 2

In a light-blocking brown bottle, 10 g of a 56% butyl acetate solution of the methacrylate polymer (having a polymer content of 5.6 g), 0.17 g of the liquid thiol monomer, 0.06 g of the photopolymerization initiator (i), 0.6 g of the photopolymerization initiator (ii) and 0.11 g of the acrylate monomer were blended and mixed at an ordinary temperature for dissolution. Thus, a resin composition (varnish) was prepared for production of an optical waveguide. A core layer was formed in the same manner as in Example 1.

Comparative Example 1

In a light-blocking brown bottle, 10 g of a 56% butyl acetate solution of the methacrylate polymer (having a polymer content of 5.6 g), 0.28 g of the acrylate monomer, 0.06 g of the photopolymerization initiator (i) and 0.6 g of the photopolymerization initiator (ii) were blended and mixed at an ordinary temperature for dissolution. Thus, a resin composition (varnish) was prepared for production of an optical waveguide. A core layer was formed in the same manner as in Example 1.

The resin compositions of Examples 1 and 2 and Comparative Example 1 were evaluated for the following properties based on the following criteria. The results are shown in Table 1.

Tackiness

An uncured film was formed by applying and drying each of the resin compositions (varnishes) for the production of the optical waveguide. A finger touch test was performed to check the surface tackiness of the uncured film. A resin composition having tackiness (surface tackiness) was rated as unacceptable (×), and a resin composition having no tackiness was rated as acceptable (○).

Curing Sensitivity

A section of each of the core layers formed by the patterning through the exposure at a lower dose (500 mJ/cm$^2$) was microscopically photographed. A core layer having a generally orthogonal edge at its projection as seen in the microscopic photograph was rated as acceptable (○)), and a core layer having an indefinite edge at its projection as seen in the microscopic photograph was rated as unacceptable (×).

TABLE 1

|  | Tackiness | Curing sensitivity |
| --- | --- | --- |
| Example 1 | ○ | ○ |
| Example 2 | ○ | ○ |
| Comparative Example 1 | ○ | x |

As can be understood from the above results, the resin compositions of Examples 1 and 2 were substantially free from tackiness and, therefore, suitable for the continuous process such as the roll-to-roll process. Further, the resin compositions of Examples 1 and 2 were improved in curing sensitivity over the resin composition of Comparative Example 1 and, therefore, had excellent curability without reduction in the mobility of active species generated by the irradiation with the ultraviolet radiation. Thus, the resin compositions of Examples 1 and 2 were each capable of forming a tackiness-free uncured film, and yet had excellent photocurability.

Although a specific form of embodiment of the instant invention has been described above in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. A liquid resin composition for production of an optical waveguide, the liquid resin composition comprising:
   (A) a (meth)acrylate polymer which is a copolymer of bisphenol-A di(meth)acrylate and a diacid anhydride, in a proportion of not less than 60 wt % based on the overall weight of the resin composition;
   (B) at least one liquid thiol monomer selected from a group consisting of pentaerythritol tetrakis(3-mercaptopropionate), tris[(3-mercaptopropionyloxy)ethyl]isocyanurate, trimethylolpropane tris(3-mercaptopropionate) and dipentaerythritol hexakis(3-mercaptopropionate); and
   (C) a photopolymerization initiator,
   wherein the thiol monomer (B) is present in a proportion of 1 to 10 parts by weight based on 100 parts by weight of the (meth)acrylate polymer (A).

2. An optical waveguide, comprising:
   a core portion for transmission of a light signal; and
   a cladding portion,
   wherein at least one of the cladding portion and the core portion is formed from a liquid resin composition comprising:
   (A) a (meth)acrylate polymer which is a copolymer of bisphenol-A di(meth)acrylate and a diacid anhydride, in a proportion of not less than 60 wt % based on the overall weight of the resin composition;

(B) at least one liquid thiol monomer selected from a group consisting of pentaerythritol tetrakis(3-mercaptopropionate), tris[(3-mercaptopropionyloxy)ethyl]isocyanurate, trimethylolpropane tris(3-mercaptopropionate) and dipentaerythritol hexakis(3-mercaptopropionate); and (C) a photopolymerization initiator, wherein the thiol monomer (B) is present in a proportion of 1 to 10 parts by weight based on 100 parts by weight of the (meth)acrylate polymer (A).

3. An optical waveguide production method for continuously producing an optical waveguide by a roll-to-roll process, the method comprising the steps of:

applying a resin composition on a flexible base paid out from a first roll to form a coating layer;

irradiating the coating layer in a predetermined pattern with ultraviolet radiation to cure an irradiated portion of the coating layer to form a core portion of the optical waveguide; and taking up the resulting optical waveguide around a second roll, wherein the resin composition is a liquid resin composition comprising:

(A) a (meth)acrylate polymer which is a copolymer of bisphenol-A di(meth)acrylate and a diacid anhydride, in a proportion of not less than 60 wt % based on the overall weight of the resin composition;

(B) at least one liquid thiol monomer selected from a group consisting of pentaerythritol tetrakis(3-mercaptopropionate), tris[(3-mercaptopropionyloxy)ethyl]isocyanurate, trimethylolpropane tris(3-mercaptopropionate) and dipentaerythritol hexakis(3-mercaptopropionate); and (C) a photopolymerization initiator, wherein the thiol monomer (B) is present in a proportion of 1 to 10 parts by weight based on 100 parts by weight of the (meth)acrylate polymer (A).

4. A liquid resin composition for production of an optical waveguide as set forth in claim 1, wherein the (meth)acrylate polymer (A) is a copolymer of bisphenol-A dimethacrylate and a diacid anhydride.

5. An optical waveguide as set forth in claim 2, wherein the (meth)acrylate polymer (A) is a copolymer of bisphenol-A dimethacrylate and a diacid anhydride.

6. An optical waveguide production method for continuously producing an optical waveguide by a roll-to-roll process as set forth in claim 3, wherein the (meth)acrylate polymer (A) is a copolymer of bisphenol-A dimethacrylate and a diacid anhydride.

* * * * *